(12) United States Patent
Morishima

(10) Patent No.: US 6,297,682 B1
(45) Date of Patent: Oct. 2, 2001

(54) DIFFERENTIAL SENSE AMPLIFIER CIRCUIT

(75) Inventor: Chikayoshi Morishima, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/547,671

(22) Filed: Apr. 12, 2000

(30) Foreign Application Priority Data

Sep. 30, 1999 (JP) .................................. 11-278489

(51) Int. Cl.[7] .................... G01R 15/00; G11C 7/00; H03F 3/45
(52) U.S. Cl. .................... 327/327; 57/65; 57/64
(58) Field of Search .................... 327/52, 54, 57, 327/55, 63–67, 563; 365/205, 207, 189.05

(56) References Cited

U.S. PATENT DOCUMENTS

| | | | |
|---|---|---|---|
| 5,155,397 | * 10/1992 | Fassino et al. | 327/54 |
| 5,963,060 | * 10/1999 | Varadarajan et al. | 327/55 |
| 6,054,879 | * 4/2000 | Meng | 327/54 |
| 6,097,635 | * 8/2000 | Chang | 365/185.21 |
| 6,118,333 | * 9/2000 | Oda | 327/563 |

FOREIGN PATENT DOCUMENTS

| | | |
|---|---|---|
| 4-159690 | 6/1992 | (JP) . |
| 5-28763 | 2/1993 | (JP) . |
| 5-120887 | 5/1993 | (JP) . |
| 6-203577 | 7/1994 | (JP) . |
| 10-69785 | 3/1998 | (JP) . |
| 10-208478 | 8/1998 | (JP) . |

* cited by examiner

*Primary Examiner*—Terry D. Cunningham
*Assistant Examiner*—Long Nguyen
(74) *Attorney, Agent, or Firm*—McDermott, Will & Emery

(57) ABSTRACT

Disclosed is an amplifier circuit comprising: an amplifier 1 which is activated when supplied with a control signal SE and which outputs a pair of amplified signals D and DC; a detection circuit 2 for detecting one of the pair of amplified signals D and DC being changed in potential and outputting a detection signal PO upon detection of the potential change; and a latching circuit 3 which receives a set signal S and the detection signal PO and which outputs the control signal SE. The latching circuit 3 starts outputting the control signal SE in response to an input of the set signal S and terminates the output of the control signal SE upon input of the detection signal PO.

17 Claims, 7 Drawing Sheets

FIG. 6A INITIALIZATION SIGNAL I
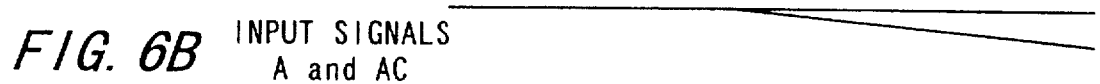
FIG. 6B INPUT SIGNALS A and AC
FIG. 6C AMPLIFIED SIGNALS D and DC
FIG. 6D SET SIGNAL S
FIG. 6E POWER OFF SIGNAL PO
FIG. 6F CONTROL SIGNAL SE
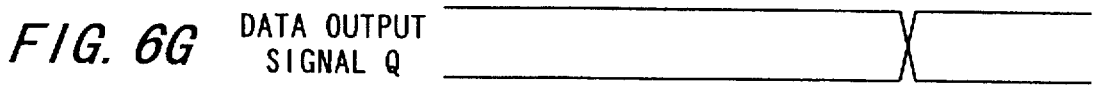
FIG. 6G DATA OUTPUT SIGNAL Q

DIFFERENTIAL SENSE AMPLIFIER CIRCUIT

BACKGROUND OF THE INVENTION

1. Field of the Invention

The present invention relates to an improved amplifier circuit dissipating less power than before.

2. Description of the Background Art

Amplifiers such as sense amplifier circuits used in memory are required to operate at high speed. As such, these circuits are most often implemented as current mirror type differential amplifier circuits. Because currents flow continuously through amplifiers of this type in operation, the amplifiers tend to consume an appreciable amount of power.

To alleviate the drawback of such power dissipation requires putting in place measures illustratively for activating the amplifier only when necessary and deactivating it at other times.

The activation time of the amplifier may be generated by a delay circuit using an inverter chain arrangement. An optimum time it takes to amplify varies depending on the circuit constitution. More concretely, the optimum time varies depending on a word bit structure in a case of memory. That is, every time a circuit is designed, a delay circuit must be redesigned which will meet the optimum activation time requirement.

There have been proposed circuit constitutions that control automatically when to end the activation time of the amplifier without resorting to a delay circuit. The proposals include those by Japanese Patent Laid-open Nos. Hei 6-203577 and Hei 5-120887.

The above-cited patent application No. Hei 6-203577 discloses a level detection circuit which inactivates a sense amplifier part on detecting a predetermined change in the output potential of the sense amplifier part. A synchronizing clock signal CK is fed to the level detection circuit. Arrangements are made so that when the synchronizing clock signal CK goes Low from High, the sense amplifier part starts its amplifying operation. The synchronizing clock signal CK must remain Low longer than the time it takes for amplified data to be latched into a latching circuit. In other words, normal amplifying operation is carried out only if the potential of the synchronizing clock signal CK is held at the Low level past the point in time at which the sense amplifier part completes its amplifying operation.

The cited patent application No. Hei 5-120887 discloses a differential amplifier circuit whose block diagram is shown in FIG. 11.

The differential amplifier circuit of FIG. 11 comprises a differential amplifying part 1001 that includes one current mirror type differential amplifier circuit, and a control circuit 1002 that generates a signal for control of the activation of the differential amplifying part 1001 upon receipt of differential output signals DO and DOC as well as a reset signal RST from the differential amplifying part 1001.

The control circuit 1002 includes: two D latches capable of getting direct inputs; two-stage inverters each of which is connected to an output terminal of each of the D latches; two-input NOR gates each of which receives an output signal from each of the two stage inverters; and an inverter supplied with an output of the NOR gate.

The two D latches that may accept direct inputs are each made up of two CMOS transmission gates, a two-input NOR gate, and an inverter.

Each direct input terminal of the two D latches operating in parallel is fed with the reset signal RST. Driving the reset signal RST High sets the output terminals of the two D latches to the Low level each.

That operation activates the differential amplifying part 1001 which in turn outputs the differential output signals DO and DOC, whereby the CMOS transmission gates in the two D latches controlling the appearance of those signals are turned on.

With the differential amplifying part 1001 activated, a potential difference between a pair of input signals A and AC fed to the differential amplifying part 1001 is amplified so that the paired differential output signals DO and DOC thus amplified are input to the corresponding two D latches. When one of the two D latches gets a Low level signal as its input, the output of that D latch goes High.

The change in level is detected by the two-input NOR gate. At the time of the detection, the two-input NOR gate turns off the CMOS transmission gates controlling the data inputs to the two D latches and inactivates the differential amplifying part 1001. This turns off the flow of currents to the differential amplifying part 1001.

In the above-described constitution, the reset signal RST which generates a signal controlling the start of amplifying operation by activation of the differential amplifying part 1001 must be inactivated before the amplifying operation of the differential amplifying part 1001 is completed.

In other words, normal performance is ensured only if the reset signal RST is driven Low before the amplifying operation of the differential amplifying part 1001 is completed.

Conventional techniques have had problems as described above. The use of the delay circuit complicates timing design. Where the amplifier activation control circuit is provided to automatically control the timing of amplifier deactivation, it is necessary to estimate the time it takes to perform the amplifying operation.

Furthermore, the circuit to automatically control the timing of amplifier deactivation tends to be large in scale and the chip size is likely to be enlarged correspondingly. Illustratively, the control circuit 1002 in the cited patent application No. Hei 5-120887 comprises as many as four CMOS transmission gates, three two-input NOR gates, and seven inverters.

SUMMARY OF THE INVENTION

It is therefore an object of the present invention to overcome the above and other drawbacks and deficiencies and to provide an amplifier circuit that dissipates less power than before through control of amplifier activation while taking up a diminished layout area, wherein the scale of a circuit to control amplifier activation is reduced.

It is another object of the present invention to provide an amplifier circuit that permits simplified timing design of a circuit for controlling amplifier activation. The above objects of the present invention are achieved by an amplifier circuit described below. The amplifier circuit includes an amplifier constituted to be activated when supplied with a first control signal and to output a pair of amplified signals. The amplifier circuit also includes a detection circuit for receiving the pair of amplified signals from the amplifier. The detection circuit detects one of the paired amplified signals being changed in potential, and outputs a detection signal upon detection of the potential change in one of the pair of amplified signals. The amplifier circuit further includes a holding circuit for receiving a second control signal and the detection signal from the detection circuit so as to output the first control signal. The holding circuit starts outputting the first control signal in response to an input of the second control signal, terminates the output of the first control signal in response to an input of the detection signal, and holds signal data in effect at the time when the second control signal is terminated.

Other objects and further features of the present invention will be apparent from the following detailed description when read in conjunction with the accompanying drawings.

BRIEF DESCRIPTION OF THE DRAWINGS

FIGS. 6A to 6G and FIGS. 9A to 9G are timing charts depicting the workings of the amplifier circuit as the first, the third or the fourth embodiment;

DESCRIPTION OF THE PREFERRED EMBODIMENTS

Figure 1:
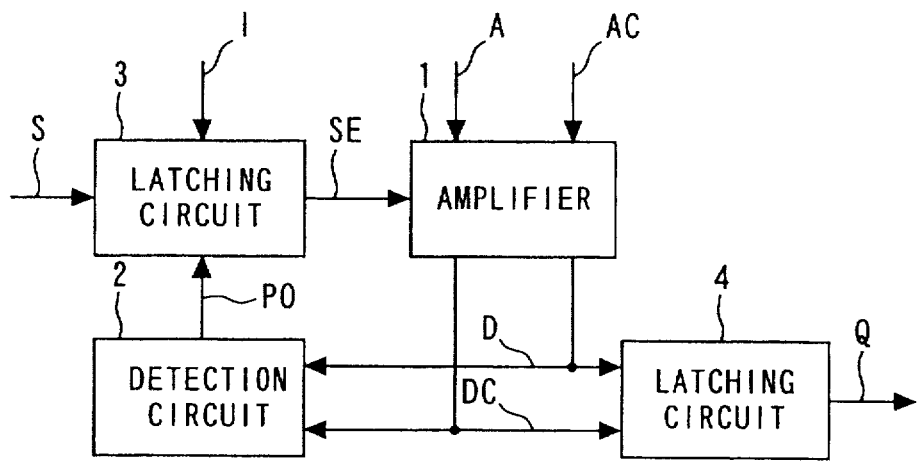
FIG. 1 is a block diagram of an amplifier circuit practiced as a first, a second, a third or a fourth embodiment of this invention.

In the following, principles and embodiments of the present invention will be described with reference to the accompanying drawings. The members and steps that are common to some of the drawings are given the same reference numerals and redundant descriptions therefor may be omitted.

First Embodiment

FIG. 1 is a block diagram of an amplifier circuit practiced as the first embodiment of this invention. The amplifier circuit comprises an amplifier 1, a detection circuit 2, and latching circuits 3 and 4. The amplifier 1 receives a pair of input signals A and AC read illustratively from memory cells, as well as a control signal SE for controlling amplifier activation. Amplifying a potential difference between the paired input signals A and AC, the amplifier 1 outputs a pair of amplified signals D and DC. The detection circuit 2 receives the amplified signals D and DC. When one of the amplified signals D and DC has its potential changed, the detection circuit 2 outputs a power-off signal PO. The latching circuit 3 is fed with the power-off signal PO, a set signal S and an initialization signal I, and outputs a control signal SE. The latching circuit 4 is given the amplified signals D and DC, and outputs a data output signal Q.

Figure 2:
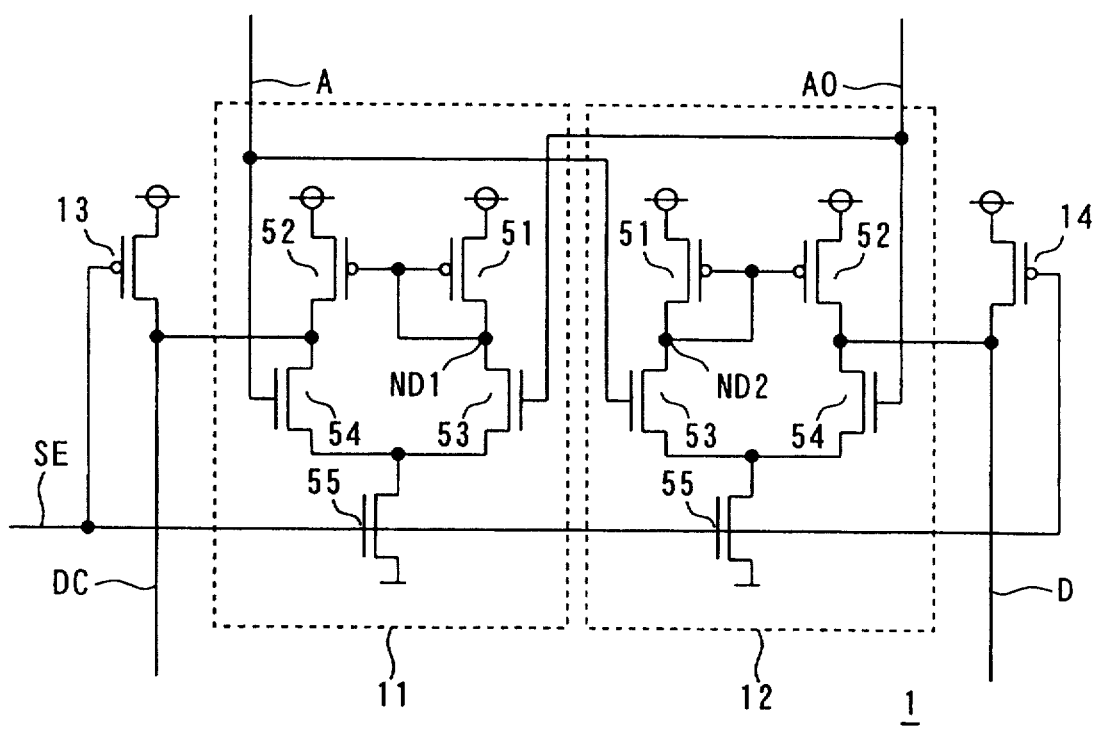
FIG. 2 is an internal block diagram of an amplifier 1 used in the first, the second or the third embodiment.

FIG. 2 is an internal block diagram of the amplifier 1. The amplifier 1 comprises two sense amplifiers 11 and 12 and PMOS transistors 13 and 14. The PMOS transistors 13 and 14 are employed to precharge up to the High level both the potential of the amplified signal DC output by the sense amplifier 11 and the amplified signal D output by the sense amplifier 12.

The two sense amplifiers 11 and 12 are each a current mirror type differential amplifier circuit that includes two PMOS transistors 51 and 52, two NMOS transistors 53 and 54 fed with the paired signals A and AC of the sense amplifiers, and an NMOS transistor 55 for controlling activation and deactivation of the sense amplifiers 11 and 12.

The amplifier 1 has the following connections: one source/drain electrode of the PMOS transistor 51 in each of the sense amplifiers 11 and 12 is connected to a power supply line, and the other source/drain electrode is connected to gate electrodes of the PMOS transistor 52 as well as to one source/drain electrode of the NMOS transistor 53.

One source/drain electrode of the PMOS transistor 52 is connected to the power supply line, and the other source/drain electrode is connected to one source/drain electrode of the NMOS transistor 54.

The other source/drain electrode of the NMOS transistor 53 is connected to the other source/drain electrode of the NMOS transistor 54 and to one source/drain electrode of the NMOS transistor 55. The other source/drain electrode of the NMOS transistor 55 is connected to ground.

The input signal A of the amplifier 1 is fed to a gate electrode of the NMOS transistor 54 in the sense amplifier 11 and to a gate electrode of the NMOS transistor 53 in the sense amplifier 12. Likewise the input signal AC of the amplifier 1 is supplied to a gate electrode of the NMOS transistor 53 in the sense amplifier 11 and to a gate electrode of the NMOS transistor 54 in the sense amplifier 12.

The other source/drain electrode of the PMOS transistor 52 in the sense amplifier 11 is connected to one source/drain electrode of the PMOS transistor 13; the signal on the signal line of the component becomes the amplified signal DC.

Likewise the other source/drain electrode of the PMOS transistor 52 in the sense amplifier 12 is connected to one source/drain electrode of the PMOS transistor 14; the signal on the signal line of the component becomes the amplified signal D.

The other source/drain electrode of each of the PMOS transistors 13 and 14 is connected to the power supply line.

The control signal SE is supplied to gate electrodes of the PMOS transistors 13 and 14, of the NMOS transistor 55 in the sense amplifier 11, and of the NMOS transistor 55 in the sense amplifier 12.

Figure 3:
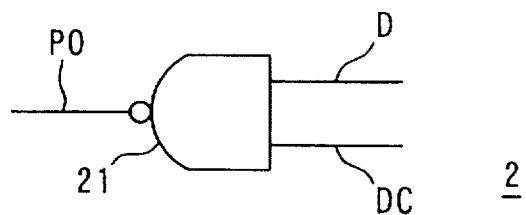
FIG. 3 is an internal block diagram of a detection circuit 2 used in the first, the second, the third or the fourth embodiment.

FIG. 3 is an internal block diagram of the detection circuit 2. The detection circuit 2 is constituted by a two-input NAND gate 21. One input terminal of the two-input NAND gate 21 is fed with the amplified signal D and the other input terminal receives the amplified signal DC. An output terminal of the two-input NAND gate 21 outputs the power-off signal PO.

Figure 4:
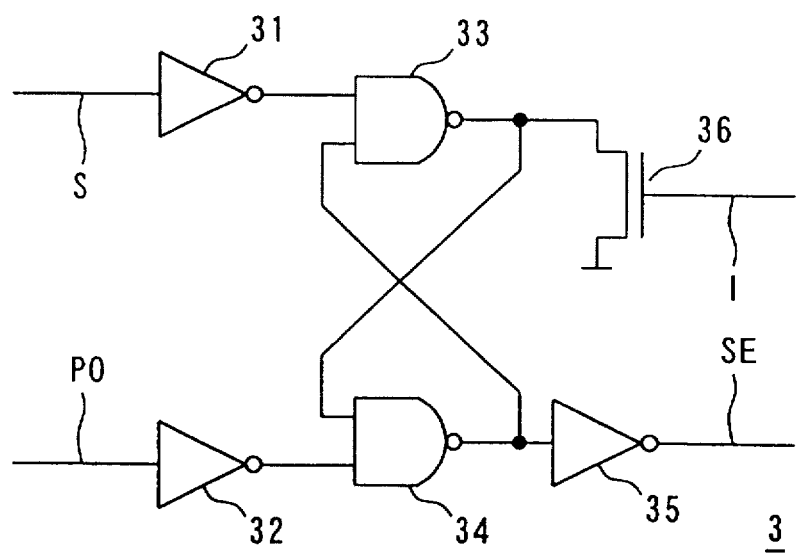
FIGS. 4, 7 and 8 are internal block diagrams each showing a latching circuit 3 used in the first, the third or the fourth embodiment.

FIG. 4 is an internal block diagram of the latching circuit 3. The latching circuit 3 comprises an inverter 31 that receives the set signal S, an inverter 32 that receives the power-off signal PO, two-input NAND gates 33 and 34 making up an RS latch, an NMOS transistor 36 that receives the initialization signal I, and an inverter 35 that outputs the control signal SE.

The set signal S is fed to the input terminal of the inverter 31. The output terminal of the inverter 31 is connected to one input terminal of the two-input NAND gate 33. The other input terminal of the two-input NAND gate 33 is connected to the output terminal of the two-input NAND gate 34 as well as to the input terminal of the inverter 35.

The input terminal of the inverter 32 is supplied with the power-off signal PO. The output terminal of the inverter 32 is connected to one input terminal of the two-input NAND gate 34. The other input terminal of the two-input NAND gate 34 is connected to the output terminal of the two-input NAND gate 33 as well as to one source/drain electrode of the NMOS transistor 36.

The initialization signal I is fed to the gate electrode of the NMOS transistor 36. The other source/drain electrode of the NMOS transistor 36 is connected to ground. The output terminal of the inverter 35 outputs the control signal SE.

Figure 5:
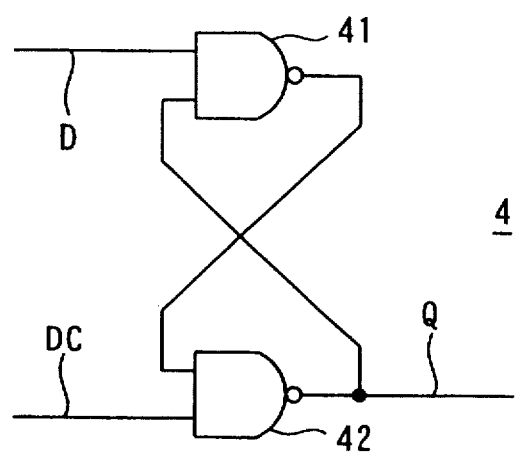
FIG. 5 is an internal block diagram of a latching circuit 4 used in the first, the second, the third or the fourth embodiment.

FIG. 5 is an internal block diagram of the latching circuit 4. The latching circuit 4 is composed of a two-input NAND gate 41 for receiving the amplified signal D, and a two-input NAND gate 42 for receiving the amplified signal DC. The two two-input NAND gates 41 and 42 constitute an RS latch.

One input terminal of the two-input NAND gate 41 is fed with the amplified signal D, and the other input terminal is connected to the output terminal of the two-input NAND gate 42; the signal on the signal line of the component constitutes the data output signal Q.

One input terminal of the two-input NAND gate 42 is supplied with the amplified signal DC, and the other input terminal of the two-input NAND gate 42 is connected to the output terminal of the two-input NAND gate 41.

How the amplifier circuit works as the first embodiment will now be described with reference to timing charts of FIGS. 6A to 6G.

The latching circuit 3 is first initialized in such a manner that the potential of the control signal SE becomes Low. For example, the potential of the initialization signal I is set temporarily to the High level upon power-up in order to initialize the latching circuit 3. As a result, the latching circuit 3 retains "0" and the control signal SE is driven Low.

It is assumed that the latching circuit 3 retains "1" if the potential of the output terminal of the two-input NAND gate 33 is on the High level and stores "0" if the output terminal potential is on the Low level.

When the potential of the control signal SE is on the Low level, the NMOS transistors 55 in the sense amplifiers 11 and 12 of the amplifier 1 are turned off each. This means that the sense amplifiers 11 and 12 are inactivated and have no currents flowing therethrough. That is, the amplifier 1 is in an inactive state.

The PMOS transistors 13 and 14 are turned on in the amplifier 1. This allows the amplified signals D and DC to be precharged up to the power supply potential.

A positive pulse is then given as the set signal S. When the set signal S goes High from Low, the latching circuit 3 latches "1" as its stored data and the control signal SE is driven High. This turns on the NMOS transistors 55 in the sense amplifiers 11 and 12 of the amplifier 1. In turn, the sense amplifiers 11 and 12 are activated and become operational while the PMOS transistors 13 and 14 are turned off in the amplifier 1. This terminates the precharging operation on the amplified signals D and DC.

The potential difference between the paired input signals A and AC given to the sense amplifiers 11 and 12 is amplified thereby. The sense amplifiers 12 and 11 output the amplified signals D and DC respectively. As the potential difference between the input signals A and AC increases, one of the amplified signals D and DC goes Low from High. At this point, the other potential remains High.

For example, if the input signal A is lower than the input signal AC in terms of potential, the amplified signal D is brought Low from High.

The two-input NAND gate 21 serving as the detection circuit 2 detects one of the amplified signals D and DC going Low from High. At the time of the detection, the two-input NAND gate 21 causes the power-off signal PO, i.e., its output, to go High from Low.

Before the power-off signal PO is driven High, the set signal S needs to be brought Low.

In other words, the pulse duration of the set signal S must be shorter than the time required to accomplish an amplifying operation in which the amplifier 1 is activated, the potential difference between the input signals A and AC is amplified, and the complementary amplified signals D and DC are output.

The amplified signals D and DC one of which is brought Low are fed to the latching circuit 4 made up of the two-input NAND gates 41 and 42. This allows the data amplified by the amplifier 1 to be latched and retained by the latching circuit 4. The retained data is output by the latching circuit 4 as the data output signal Q.

When the power-off signal PO goes High, the latching circuit 3 has its contents reset from "1" to "0." This drives the control signal SE Low. The operation switches the sense amplifiers 11 and 12 from an active to an inactive state, putting the amplifier 1 in an inoperative state. At the same time, the amplified signals D and DC start being precharged up to the power supply potential.

The amplified signals D and DC are then brought High, which causes the power-off signal PO output by the two-input NAND gate 21 of the detection circuit 2 to go Low from High. At this point, the stored data in the latching circuit 3 remain unchanged at "0" because the set signal S stays Low.

The control signal SE thus remains Low and the sense amplifiers 11 and 12 of the amplifier 1 are not activated. That is, the amplifiers 11 and 12 remain in the inoperative state.

At that point, the data amplified by the amplifier 1 are retained in the latching circuit 4. The data in the latching circuit 4 remain unchanged after the amplified signals D and DC have been precharged up to the High level. This leaves unaffected the output data signal Q from the latching circuit 4.

As described above, when one of the amplified signals D and DC is detected going Low, the power-off signal PO is output to inactivate the amplifier 1. It is necessary to provide suitable timing design such that before the amplifier 1 becomes inactive, the data representing one of the amplified signals D and DC which has gone Low are latched and retained by the latching circuit 4.

In the structure described above, the latching circuit 3 stores "1" when the set signal S is activated temporarily so that the control signal SE is driven High. This activates the amplifier 1; currents start flowing through the now-active amplifier 1 whereby amplifying operation is carried out.

With the amplifier 1 in operation, the potential difference between the paired input signals A and AC is amplified. The detection circuit 2 detects one of the resulting amplified signals D and DC getting changed in terms of potential. The detected signal, which constitutes the power-off signal PO, is fed to the latching circuit 3. The power-off signal PO thus supplied resets the latching circuit 3 to "0" and brings the control signal SE Low. This inactivates the amplifier 1 and stops the flow of currents therethrough.

That is, the amplifier 1 is activated only during the period when amplifying operation is needed; the amplifier 1 is inactivated at other times. Thus currents flow through the amplifier 1 only during the amplifying period, which translates into a reduction in power dissipation. The performance remains stable because no intermediate potential is used for control purposes.

In the first embodiment, a basic circuit arrangement which automatically ends activation of the amplifier 1 comprises one two-input NAND gate 21 making up the detection circuit 2, and two two-input NAND gates 33 and 34 as well as three inverters 31, 32 and 35 constituting the latching circuit 3.

Figure 11:
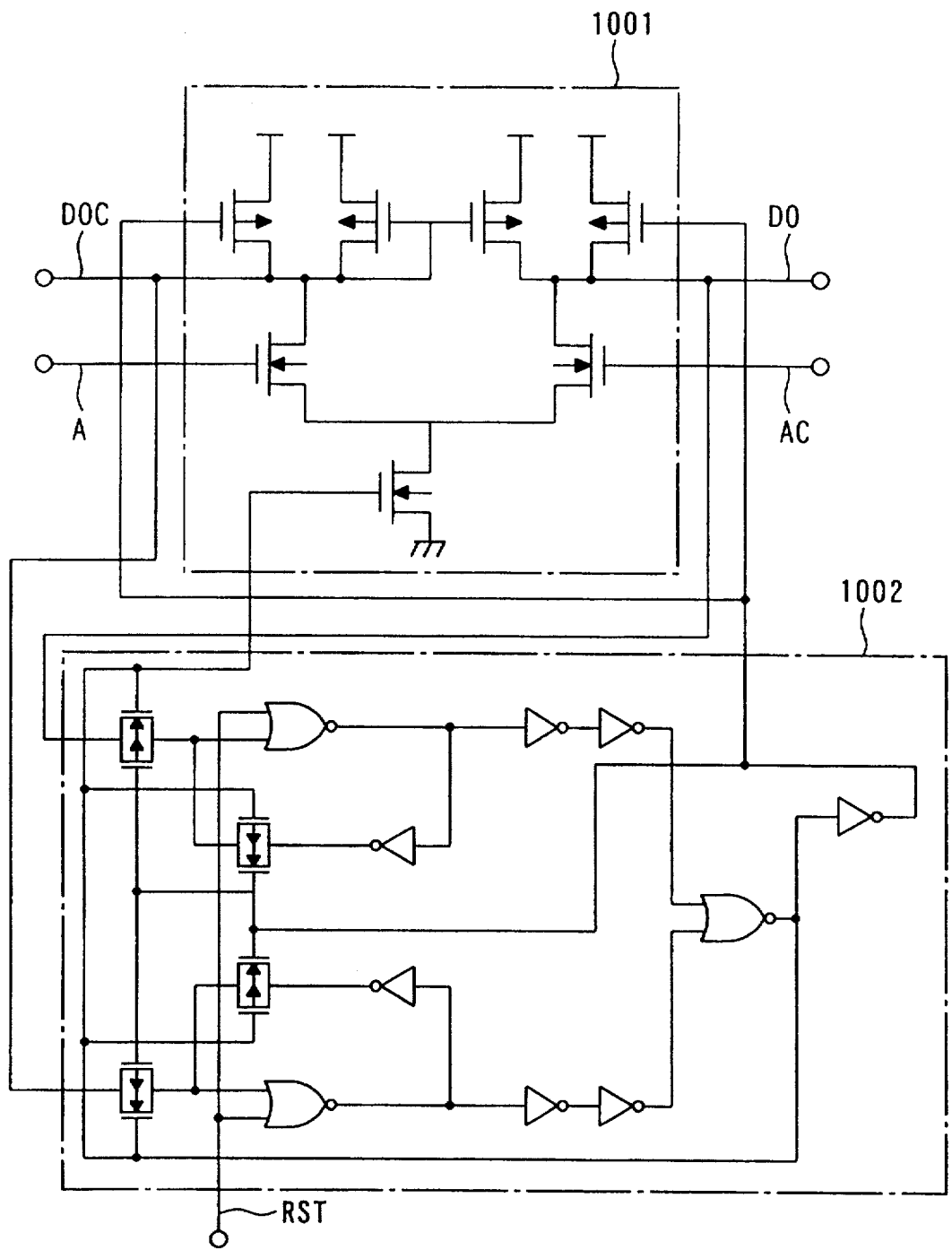
FIG. 11 is an internal block diagram of a conventional amplifier circuit.

An equivalent of such a basic circuit arrangement in the cited patent application No. Hei 5-120887 is the control circuit 1002 shown in FIG. 11. The control circuit 1002 has a large number of transistors: four CMOS transmission gates, three two-input NOR gates, and seven (theoretically three) inverters.

The first embodiment, as described, uses fewer components than its conventional counterpart to automatically end activation of the amplifier having the same functionality as before and thereby to reduce power dissipation of the amplifier. The embodiment thus requires a less chip layout area than before in mounting the amplifier circuit.

The amplifier 1 incorporates the PMOS transistors 13 and 14 for precharging the amplified signals D and DC which are amplifier 1 outputs. The PMOS transistors 13 and 14 are turned on when the amplifier 1 is inactivated. The activated transistors keep the amplified signals D and DC at the power supply potential. This eliminates the need for a circuit that would activate the detection circuit 2 only while the amplifier 1 is in the active state, and allows the detection circuit 2 to continuously monitor the amplified signals D and DC for their potential levels. The detection circuit 2 is thus implemented with a simplified circuit constitution.

As another benefit, the detection circuit 2 is run in a stable fashion because the amplified signals D and DC are each kept at the power supply potential while the amplifier 1 is being inactivated.

Applying the initialization signal I resets the stored data in the latching circuit 3 to "0" so that the control signal SE will not be output. In this manner, the amplifier 1 is readily inactivated when amplifying operation is not necessary.

Where the initialization signal I is applied upon power-up, the amplifier 1 is prevented from getting activated immediately after power is supplied. This prevents the flow of currents through the amplifier 1 while amplifying operation is not needed, whereby wasteful power dissipation is forestalled.

Figure 7:
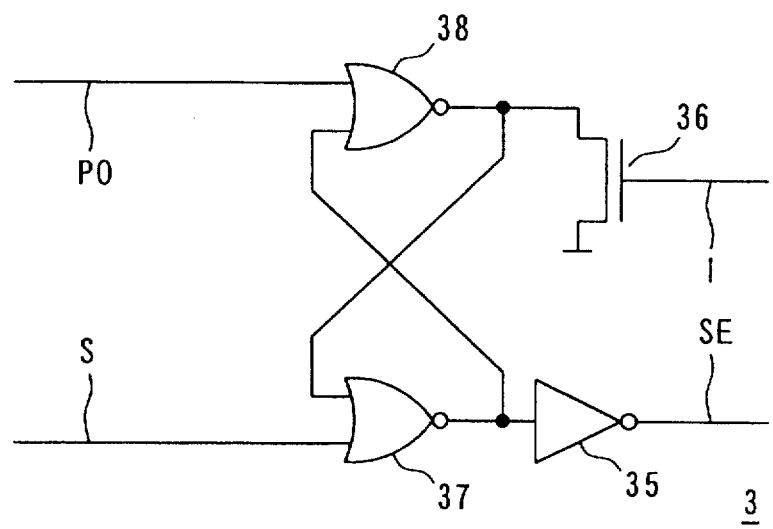

Alternatively, the latching circuit 3 shown in FIG. 4 may be replaced with another latching circuit depicted in FIG. 7. The alternative latching circuit 3 in FIG. 7 comprises a two-input NOR gate 37 that receives the set signal S, a two-input NOR gate 38 that receives the power-off signal PO, an NMOS transistor 36 that receives the initialization signal I, and an inverter 35 that outputs the control signal SE.

One input terminal of the two-input NOR gate 37 is fed with the set signal S. The other input terminal of the two-input NOR gate 37 is connected to the output terminal of the two-input NOR gate 38 and to one source/drain electrode of the NMOS transistor 36.

One input terminal of the two-input NOR gate 38 is supplied with the power-off signal PO. The other input terminal of the two-input NOR gate 38 is connected to the output terminal of the two-input NOR gate 37 as well as to the input terminal of the inverter 35.

The initialization signal I is fed to the gate electrode of the NMOS transistor 36. The other source/drain electrode of the NMOS transistor 36 is connected to ground. The output terminal of the inverter 35 outputs the control signal SE.

It is assumed that the latching circuit 3 stores "1" if the output terminal of the two-input NOR gate 38 is on the High level, and retains "0" if the output terminal of the two-input NOR gate 38 is on the Low level. With "0" held in the latching circuit 3, the control signal SE is brought Low, which inactivates the amplifier 1.

The workings of the alternative latching circuit 3 depicted FIG. 7, which operates in the same manner as the latching circuit 3 shown in FIG. 2, will not be described further.

Where the alternative latching circuit 3 of FIG. 7 is utilized, the basic circuit arrangement which automatically ends activation of the amplifier in the first embodiment will comprise: one two-input NAND gate 21 making up the detection circuit 2, and two two-input NOR gates 37 and 38 as well as one inverter 35 constituting the latching circuit 3. This constitution is implemented with even fewer transistors than the above-described setup incorporating the latching circuit 3 of FIG. 4.

Second Embodiment

An amplifier circuit practiced as the second embodiment of the invention is a variation of the first embodiment wherein the internal constitution of the latching circuit 3 in FIG. 4 is modified. The other aspects of the second embodiment are the same as those of the first embodiment. That is, the block structure of the amplifier circuit making up the second embodiment is the same as that of the first embodiment shown in FIG. 1. Descriptions of these overlapping aspects will not be repeated.

Likewise the amplifier 1, detection circuit 2 and latching circuit 4 of the second embodiment are identical to their counterparts in the first embodiment shown in FIGS. 2, 3 and 5. The structures, connections and operations of the overlapping components will not be described further.

Figure 8:
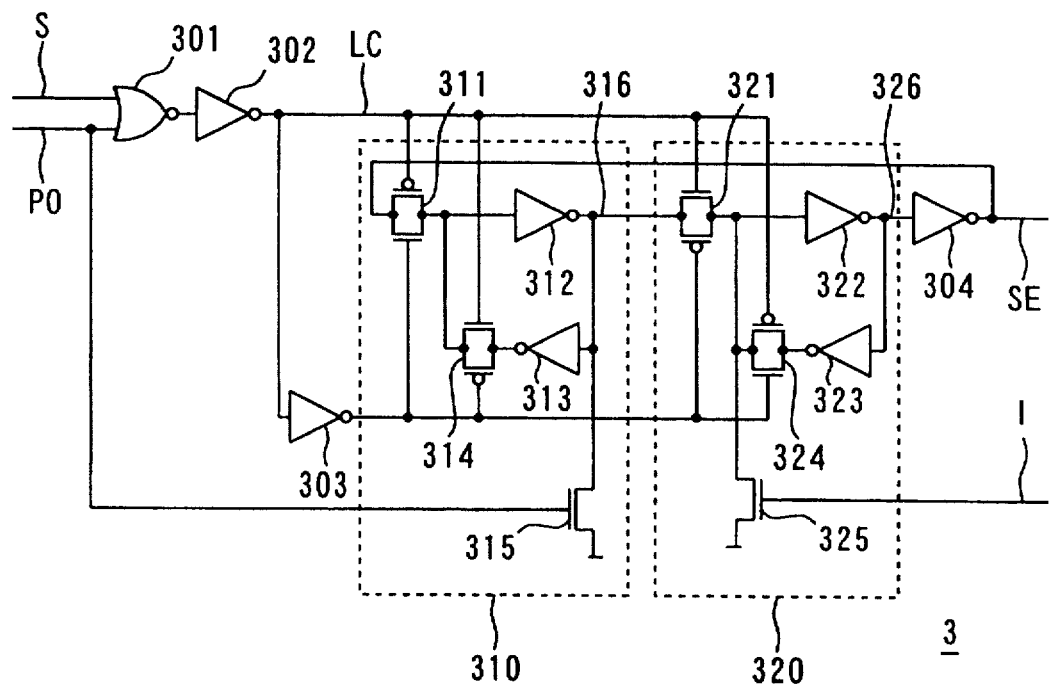
Figure 9:
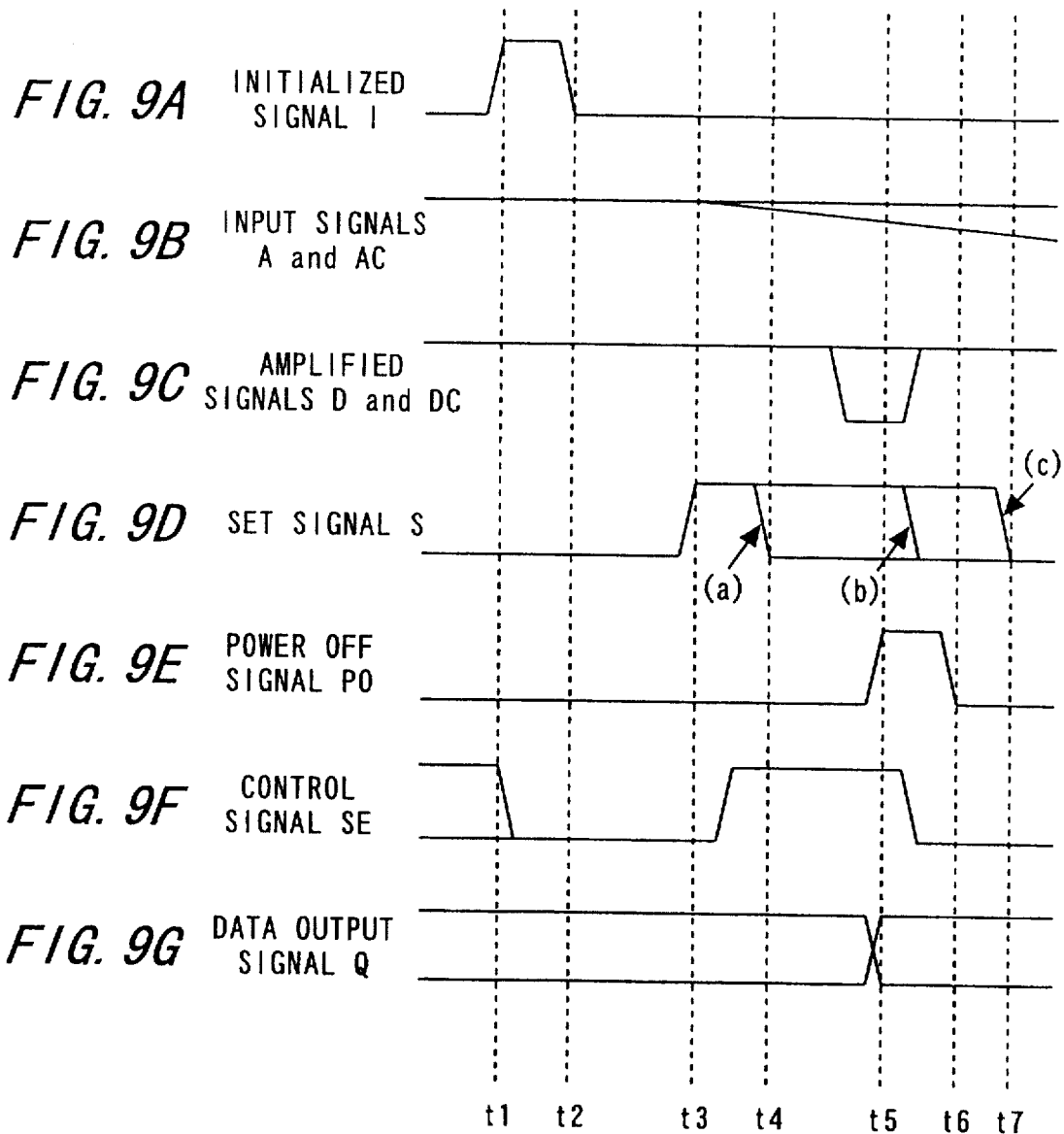

FIG. 8 is an internal block diagram of the latching circuit 3 used in the second embodiment. The latching circuit 3 comprises D latches 310 and 320 having two direct terminals, a two-input NOR gate 301 that receives the set signal S and power-off signal PO, and three inverters 302, 303 and 304.

The D latch 310 includes two CMOS transmission gates 311 and 314, two inverters 312 and 313, and an NMOS transmission gate 315. Likewise the D latch 320 has two CMOS transmission gates 321 and 324, two inverters 322 and 323, and an NMOS transmission gate 325.

The latching circuit 3 has the following connections: one input terminal of the two-input NOR gate 301 is fed with the set signal S, and the other input terminal of the two-input NOR gate 301 is supplied with the power-off signal PO. The output terminal of the two-input NOR gate 301 is connected to the input terminal of the inverter 302.

The output terminal of the inverter 302 outputs a latch control signal LC. The output terminal of the inverter 302 is connected to the input terminal of the inverter 303, to a PMOS side gate electrode of the CMOS transmission gate 311 as well as to an NMOS side gate electrode of the CMOS transmission gate 314 in the D latch 310, and to an NMOS side gate electrode of the CMOS transmission gate 321 as well as to a PMOS side gate electrode of the CMOS transmission gate 324 in the D latch 320.

The output terminal of the inverter 303 is connected to an NMOS side gate electrode of the CMOS transmission gate 311 and to a PMOS side gate electrode of the CMOS transmission gate 314 in the D latch 310, and to a PMOS side gate electrode of the CMOS transmission gate 321 as well as to an NMOS side gate electrode of the CMOS transmission gate 324 in the D latch 320.

One source/drain electrode of the CMOS transmission gate 311 in the D latch 310 is connected to the input terminal of the inverter 312 and to one source/drain electrode of the CMOS transmission gate 314.

The output terminal of the inverter 312 is connected to a memory node 316, to the input terminal of the inverter 313, to one source/drain electrode of the NMOS transmission gate 315, and to one source/drain electrode of the CMOS transmission gate 321 in the D latch 320.

The other source/drain electrode of the NMOS transmission gate 315 is connected to ground. The gate electrode of the NMOS transmission gate 315 is supplied with the power-off signal PO.

The other source/drain electrode of the CMOS transmission gate 321 in the D latch 320 is connected to the input terminal of the inverter 322, to one source/drain electrode of the CMOS transmission gate 324, and to one source/drain electrode of the NMOS transmission gate 325.

The output terminal of the inverter 322 is connected to a memory node 326, to the input terminal of the inverter 323, and to the input terminal of the inverter 304.

The other source/drain electrode of the NMOS transmission gate 325 is connected to ground. The gate electrode of the NMOS transmission gate 325 is fed with the initialization signal I.

The output terminal of the inverter 304 is connected to the other source/drain electrode of the CMOS transmission gate 311 in the D latch 310. The signal on the signal line of the component constitutes the control signal SE.

How the amplifier circuit of the second embodiment works will now be described with reference to the timing charts of FIG. 9A to 9G. This amplifier circuit is structurally the same as the first embodiment except for the latching circuit 3, and the basic workings of the first and the second embodiments are the same. Thus the description that follows will focus on how the latching circuit 3 operates.

The latching circuit 3 is first initialized in such a manner that the control signal SE, i.e., its output signal, is brought Low. In the timing chart of FIG. 9, when the initialization signal I is driven High at time t1, the NMOS transmission gate 325 is turned on in the D latch 320 to drive the memory node 326 High. The control signal SE, i.e., an inverted signal from the memory node 326, is brought Low whereby the amplifier 1 is inactivated. The initialization is required for putting the amplifier 1 in the inactive state upon power-up.

At time t2, the initialization signal I goes Low from High. At this point, the set signal S and power-off signal PO remain Low.

In that state, the latch control signal LC fed to the D latches 310 and 320 is on the Low level, so that the CMOS transmission gate 324 is turned on in the D latch 320, This keeps the memory node 326 on the High level, allowing the control signal SE to remain Low.

With the CMOS transmission gate 311 turned on in the D latch 310, the Low level of the control signal SE is transmitted so that the memory node 316 is driven High in the D latch 310.

At time t3, the set signal S goes High from Low. At this point, the initialization signal I and power-off signal PO remain Low.

In that state, the latch control signal LC goes High from Low, turning the CMOS transmission gate 311 off and the CMOS transmission gate 314 on in the D latch 310. This allows the memory node 316 to remain High. At this point, the CMOS transmission gate 321 is turned on and CMOS transmission gate 324 is turned off in the D latch 320, whereby the potential of the memory node 316 is transmitted through the CMOS transmission gate 321.

As a result, the memory node 326 is brought Low. In turn, the control signal SE is driven High so that the amplifier 1 is activated.

Described below is what takes place when the set signal S goes Low from High at time t4. This applies to a case (a) shown in the timing chart of FIG. 9D. At this time point, the initialization signal I and power-off signal PO remain Low.

In that state, the latch control signal LC goes Low from High. This turns off the CMOS transmission gate 321 and turns on the CMOS transmission gate 324 in the D latch 320, permitting the memory node 326 to stay Low.

Consequently, the control signal SE remains High. This keeps the amplifier 1 continuously activated.

With the CMOS transmission gate 311 turned on and with the CMOS transmission gate 314 turned off in the D latch 310, the potential of the control signal SE is transmitted through the CMOS transmission gate 311. This brings the memory node 316 Low.

At time t5, the power-off signal PO goes High from Low. At this point, the initialization signal I and set signal S remain Low. This applies to the case (a) in the timing chart of FIG. 9D.

With the NMOS transmission gate 315 turned on in the D latch 310 in the above case, the memory node 316 is brought Low. At the same time, the latch control signal LC goes High from Low. This turns off the CMOS transmission gate 311 and turns on the CMOS transmission gate 314, causing the memory node 316 to remain Low. Because the CMOS transmission gate 321 is turned on and the CMOS transmission gate 324 is turned off in the D latch 320, the potential of the memory node 316 is transmitted through the CMOS transmission gate 321.

As a result, the memory node 326 is driven High, which brings the control signal SE Low. This causes the amplifier 1 to leave its active state to enter an inactive state.

At time t6, the power-off signal PO goes Low from High. At this point, the initialization signal I and set signal S remain Low. This applies to the case (a) in the timing chart of FIG. 9D. The workings in this case are the same as those at time t4 and thus will not be described further. From this point on, operations at time t2 through time t6 are repeated.

Below is a description of what takes place when the set signal S remains High at the time t5 when the power-off signal PO goes High from Low. This applies to cases (b) and (c) in the timing chart of FIG. 9D. The initialization signal I is on the Low level at this point.

In the cases (b) and (c) in FIG. 9D, the set signal S stays High at time t4. This means that the operation at time t3 continues to time t4.

With the NMOS transmission gate 315 turned on in the D latch 310, the memory node 316 is brought Low. The latch control signal LC stays High, the CMOS transmission gate 311 is turned off, and the CMOS transmission gate 314 is turned on. This keeps the memory node 316 on the Low level. Because the CMOS transmission gate 321 is turned on and the CMOS transmission gate 324 is turned off in the D latch 320, the potential of the memory node 316 is transmitted through the CMOS transmission gate 321.

Consequently, the memory node 326 is driven High, which brings the control signal SE Low. This causes the amplifier 1 to switch from the active state to the inactive state.

At time t6, the power-off signal PO goes Low from High. Below is a description of what takes place when the set signal S goes Low from High between time t5 and time t6. This applies to the case (b) in the timing chart of FIG. 9D. The initialization signal I is on the Low level at this point.

In the case above, the power-off signal PO, initialization signal I and latch control signal LC remain unchanged in terms of potential. That is, the state in effect at time t5 continues unchanged. From this point on, operations at t2 through t6 are repeated.

At time t6, the power-off signal PO goes Low from High. Below is a description of what takes place when the set signal S remains High. This applies to the case (c) in the timing chart of FIG. 9D. The initialization signal I is on the Low level at this point.

In the above case, the latch control signal LC stays unchanged at the High level. With the CMOS transmission gate 311 turned off and with the CMOS transmission gate 314 turned on in the D latch 310, the memory node 316 is kept on the Low level. Because the CMOS transmission gate 321 is turned on and the CMOS transmission gate 324 is turned off in the D latch 320 at this point, the potential of the memory node 316 is transmitted through the CMOS transmission gate 321.

Since the memory node 326 remains unchanged at the High level, the control signal SE remains Low. This causes the amplifier 1 to stay in its inactive state.

Below is a description of what takes place at time t7 when the set signal S goes Low from High. This applies to the case (c) in the timing chart of FIG. 9D. The initialization signal I and power-off signal PO are on the Low level at this point. The operations in this case are the same as those at time t4 and thus will not be described further. From this point on, operations at time t2 through t7 are repeated.

The latching circuit 3 of FIG. 8 is installed as described above. Turning on momentarily the set signal S brings the memory node 326 Low in the latching circuit 3. This drives the control signal SE High, activating the amplifier 1. Currents are then allowed to flow through the amplifier 1 which is readied for amplifying operation. That is, the amplifier is now in the active state.

With the amplifier 1 in operation, the potential difference between the paired input signals A and AC is amplified. One of the amplified signals D and DC derived from the amplifying operation develops a change in potential, which is detected by the detection circuit 2. The detected signal, i.e., power-off signal PO, is fed to the latching circuit 3. This drives the memory node 326 High in the latching circuit 3, thereby bringing the control signal SE Low.

The Low-level control signal SE turns off the amplifier 1. Currents stop flowing through the amplifier 1, which translates into a reduction in power dissipation. The performance remains stable because no intermediate potential is used for control purposes.

The latching circuit 3 of the first embodiment shown in FIG. 4 requires that the set signal S go Low from High before the power-off signal PO is driven High from Low. In the latching circuit 3 of the second embodiment in FIG. 8, the control signal SE is generated by detecting only a leading edge of the set signal S going High from Low. This means that the set signal S may be driven Low from High at any time before the set signal S is brought High from Low next.

In the latching circuit 3 of the second embodiment, the set signal S may go Low from High before the power-off signal PO is driven High (case (a) in FIG. 9D), while the power-off signal PO is being High (case (b) in FIG. 9D), or after the power-off signal PO is brought Low (case (c) in FIG. 9D). In any of these cases, the performance of the latching circuit 3 remains undisturbed.

With the above-described constitution in place, only leading edges of the control signal SE are used to control the amplifying operation. Because the timings of trailing edges of the control signal SE need not be considered, the design of the amplifier circuit is facilitated.

The amplifier 1 incorporates the PMOS transistors 13 and 14 for precharging the amplified signals D and DC, i.e., the outputs of the amplifier 1. The PMOS transistors 13 and 14 are turned on when the amplifier 1 is inactivated, thereby keeping the amplified signals D and DC at the power supply potential. This eliminates the need for controlling the operative timings of the detection circuit 2; the amplified signals D and DC need only be monitored continuously. This makes it possible to implement the detection circuit 2 in a simplified constitution.

In addition, because the amplified signals D and DC are held at the power supply potential while the amplifier 1 is in the inactive state, the detection circuit 2 is run in a stable fashion.

With the second embodiment, applying the initialization signal I drives the memory node 326 High in the latching circuit 3 to keep the control signal SE from getting output. This means that whenever amplifying operation is not needed, the amplifier 1 is readily turned off.

When the initialization signal I is applied upon power-up, the amplifier 1 is prevented from getting activated immediately after power is supplied. This prevents the flow of currents through the amplifier 1 while amplifying operation is not needed, whereby wasteful power dissipation is forestalled.

Third Embodiment

The block structure of an amplifier circuit practiced as the third embodiment of the invention is the same as that of the first embodiment in FIG. 1 and thus will not be described further. The amplifier 1, detection circuit 2, and latching circuits 3 and 4 making up the third embodiment are the same in internal structure as their counterparts of the first embodiment shown in FIGS. 2, 3, 4 and 5 respectively. Thus the constitutions, connections, operations and effects of these overlapping components will not be described further.

In the amplifier 1, a small potential difference between the paired input signals A and AC triggers a change in the amplified signals D and DC. Thus a noise that may be contained in the input signals A and AC can trigger a momentary output of faulty data.

If the detection circuit 2 reacts to such erroneously amplified signals D and DC, the power-off signal PO will reset the contents of the latching circuit 3 to "0." Such an eventuality can inadvertently inactivate the amplifier 1 whereas its active state should not be interrupted at the moment.

The trouble is averted by offsetting illustratively the amplifier 1 in such a manner that the amplified signals D and DC will not be readily disrupted despite slight changes in the input signals A and AC. Alternatively, the detection circuit 2 may be offset in such a way that changes in the amplified signals D and DC are difficult to detect.

An offset of the amplifier 1 will now be described. In the third embodiment, the amplifier 1 is said to be not offset when, with the input signals A and AC equalized in terms of potential, the paired differential outputs of the sense amplifier 11 as well as those of the sense amplifier 12 are on the same potential level.

For example, the proportions of PMOS and NMOS transistors in terms of driving capability have the following relationship:

$$(P1/N1)=(P2/N2)=(P3/N3)=(P4/N4)$$

where P1, N1, P2 and N2 denote respectively the driving capabilities of the PMOS transistor 52, NMOS transistor 54, PMOS transistor 51, and NMOS transistor 53 in the sense amplifier 11. Likewise, P3, N3, P4 and N4 represent respectively the driving capabilities of the PMOS transistor 52, NMOS transistor 54, PMOS transistor 51, and NMOS transistor 53 in the sense amplifier 12.

It is assumed that the source/drain electrode of the PMOS transistor 51 and that of the NMOS transistor 53 in the sense amplifier 11 are connected to a node ND1 and that the source/drain electrode of the PMOS transistor 51 and that of the NMOS transistor 53 in the sense amplifier 12 are connected to a node ND2.

The paired differential outputs of the sense amplifier 11 constitute the amplified signal DC and a signal on the node ND1. Likewise the paired differential outputs of the sense amplifier 12 form the amplified signal D and a signal on the node ND2.

In the setup above, if the input signals A and AC of the amplifier 1 are equal in terms of potential, then the amplified signal DC, the signal on the node ND1, the amplified signal D, and the signal on the node ND2 all have the same potential. This is the state in which the amplifier 1 is not offset.

The amplifier 1 is brought into offset state by changing the proportions of driving capabilities for the left- and right-hand side transistors constituting each of the sense amplifiers 11 and 12. That is, the amplifier 1 of offset state includes the sense amplifiers 11 and 12 in each of which the proportions of driving capabilities are changed for the PMOS and NMOS transistors 52 and 54 connected to one sense amplifier output terminal outputting the amplified signal D or DC, as opposed to the PMOS and NMOS transistors 51 and 53 connected to the other sense amplifier output terminal constituting the node ND1 or ND2.

More specifically, the PMOS and NMOS transistors are subject to the following relations in terms of driving capability:

(P1/N1)>(P2/N2) and (P3/N3)>(P4/N4)

Illustratively, if the transistors forming the sense amplifiers 11 and 12 have the same gate length each, then those NMOS transistors 54 in the sense amplifiers 11 and 12 which correspond to N1 and N3 respectively are each made smaller in size than their counterparts used where there is no offset.

Alternatively, those PMOS transistors 52 in the sense amplifiers 11 and 12 which correspond to P1 and P3 respectively may each be made larger in size than their counterparts used where no offset is implemented.

Generally, if the input signals A and AC of the amplifier 1 are equal in potential, the amplified signals D and DC have the same potential. A change in the proportions of driving capabilities between the PMOS and NMOS transistors for offset purposes brings the potential levels of the amplified signals D and DC of the amplifier 1 closer to the power supply potential than where offset is not provided. In such a case, the potential levels of the signals on the nodes ND1 and ND2 are lower than those in effect without offset.

As a result, a slight noise that may be contained in the input signals A and AC is prevented from appreciably affecting the amplified signals D and DC. The detection circuit 2 thus will not be too prone to detect a false change in the amplified signals, whereby the latching circuit 3 is better protected from malfunctioning. This provides an amplifier circuit that is resistant to noise.

An offset of the detection circuit 2 will now be described. The offset is implemented illustratively by lowering a logical threshold voltage of the two-input NAND gate 21 forming the detection circuit 2. In that state, the power-off signal PO output by the two-input NAND gate 21 will not go High even if the potential level of the amplified signals D and DC, i.e., input signals of the two-input NAND gate 21, comes down slightly from the High level. The power-off signal PO stays constant unless the potential of the amplified signals D and DC drops below the logical threshold voltage.

More specifically, the logical threshold value of the two-input NAND gate 21 need only be made lower than that of any other two-input NAND gate that may exist in the same chip.

Illustratively, the logical threshold voltage of the two-input NAND gate 21 may be made lower than those of the two-input NAND gates 41 and 42 forming the RS latch of the latching circuit 4.

Preferably, the logical threshold voltage of the two-input NAND gate 21 should be made lower than that of any two-input NAND gate furnished as standard in the same chip.

In the setup above, a slight noise in the amplified signals D and DC will not trigger an output of the power-off signal PO. With the latching circuit 3 thus prevented from acting inadvertently, an amplifier circuit resistant to noise may be implemented.

The latching circuit 3 shown in FIG. 4 may be replaced with another latching circuit 3 depicted in FIG. 7. The internal structure, connections, and operations of the latching circuit 3 in FIG. 7 are the same as those of its partially modified counterpart in the first embodiment and thus will not be described further.

The latching circuit 3 shown in FIG. 4 may alternatively be replaced with another latching circuit 3 illustrated in FIG. 8. The internal structure, connections, and operations of the latching circuit 3 in FIG. 8 are the same as those of its counterpart in the second embodiment and thus will not be described further.

Where the latching circuit 3 of FIG. 7 or 8 is utilized, the above-described trouble still persists if the amplifier 1 outputs the amplified signals D and DC in reaction to noise and if the detection circuit 2 detects the resulting faulty change in the amplified signals D and DC.

The drawback above is circumvented either by offsetting previously the amplifier 1 as described in connection with the third embodiment, or by offsetting the detection circuit 2 so that it will not be too prone to detect changes in the amplified signals D and DC. Specific measures to take are the same as those described in conjunction with the latching circuit 3 of FIG. 4 and thus will not be described further. With these measures taken, a noise-resistant amplifier circuit is also implemented.

Although the sense amplifiers 11 and 12 constituting the amplifier 1 of the third embodiment were shown employing a current mirror type differential amplifier circuit each, this is not limitative of the invention. Other differential amplifier circuits may be used instead. However, the presence of noise in such other types of differential amplifier circuit still results in the above-described drawback specific to the amplifier circuit 1.

The trouble should be averted by offsetting the amplifier 1 incorporating the differential amplifier circuits in question. The offset is implemented by creating a difference in size between the transistor connected to one output terminal and the transistor connected to the other output terminal in each differential amplifier circuit. The arrangement provides an amplifier circuit that is resistant to noise.

Fourth Embodiment

An amplifier circuit practiced as the fourth embodiment of the invention is a variation of the third embodiment wherein the internal constitution of the amplifier 1 in FIG. 2 is modified. The other aspects of the fourth embodiment are the same as those of the third embodiment.

The block structure of the amplifier circuit making up the fourth embodiment is the same as that of the third embodiment shown in FIG. 1 and thus will not be described further.

Likewise the internal structures of the detection circuit 2 and latching circuits 3 and 4 of the fourth embodiment are identical to those of their counterparts in the third embodiment shown in FIGS. 3, 4 and 5. The structures, connections and operations of these overlapping components will not be described further.

Figure 10:
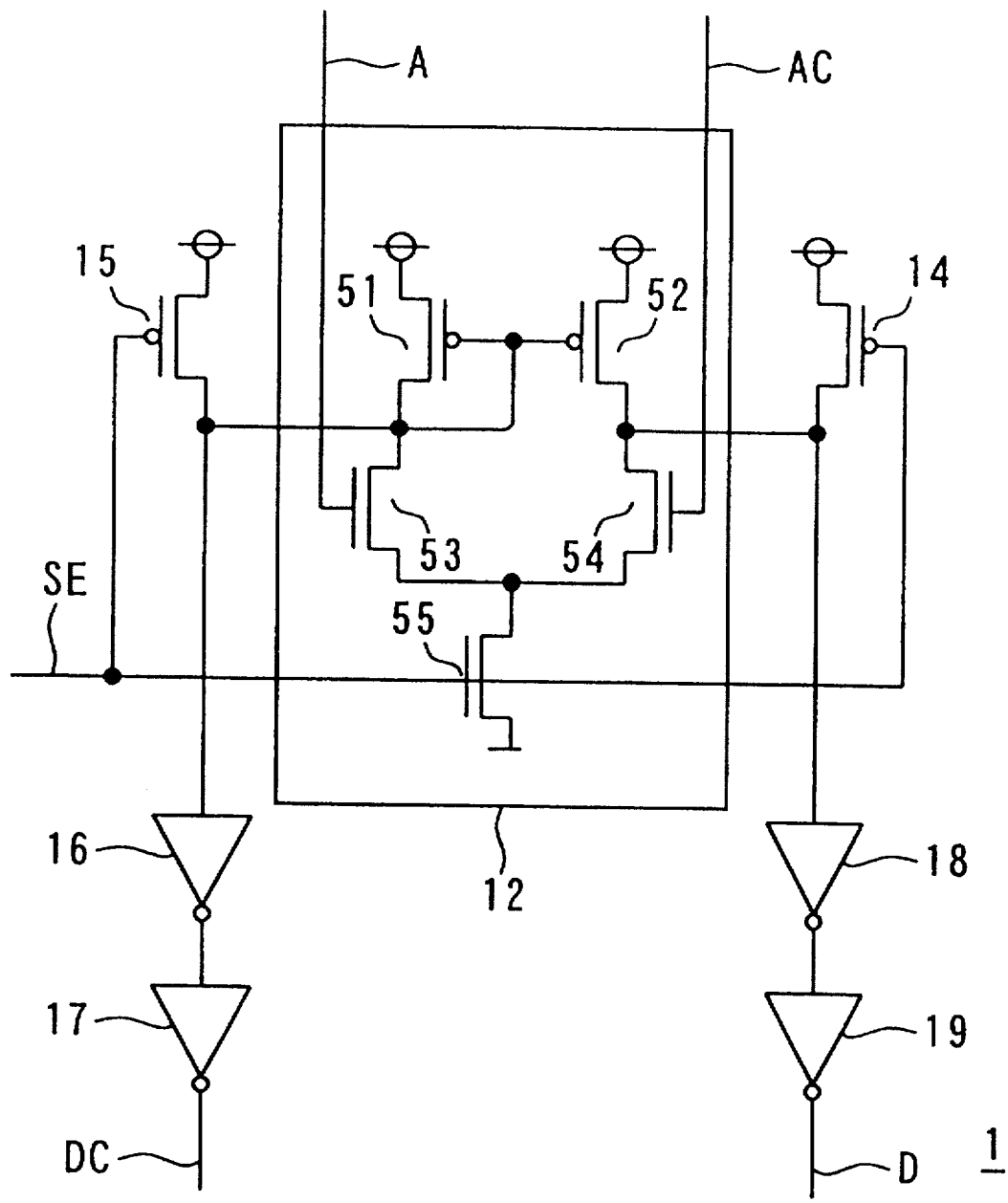
FIG. 10 is an internal block diagram of another amplifier 1 used in the fourth embodiment.

FIG. 10 is an internal block diagram of the amplifier 1 used in the fourth embodiment. The amplifier 1 in FIG. 10 comprises a sense amplifier 12 of a current mirror type differential amplifier circuit, two PMOS transistors 14 and 15 for precharging a pair of output signals of the sense amplifier 12, and four inverters 16 through 19.

The internal structure of the sense amplifier 12 in FIG. 10 is the same as that of the sense amplifier 12 in FIG. 2, and the connections involved in the structure will not be described further.

Input signals A and AC are fed respectively to the gate electrodes of NMOS transistors 53 and 54 in the sense amplifier 12. The source/drain electrode of a PMOS transistor 51 and that of an NMOS transistor 53 are connected to a signal line which in turn is connected to one source/drain electrode of the PMOS transistor 15 and to the input terminal of the inverter 16. The other source/drain electrode of the PMOS transistor 15 is connected to a power supply line.

Likewise the source/drain electrode of a PMOS transistor 52 and that of an NMOS transistor 54 are connected to a signal line which in turn is connected to one source/drain electrode of the PMOS transistor 14 and to the input terminal of the inverter 18. The other source/drain electrode of the PMOS transistor 14 is connected to the power supply line.

A control signal SE is supplied to the gate electrodes of the PMOS transistors 14 and 15 and of an NMOS transistor 55. The output terminal of the inverter 16 is connected to the input terminal of the inverter 17. The output terminal of the inverter 17 outputs an amplified signal DC. The output terminal of the inverter 18 is connected to the input terminal of the inverter 19. The output terminal of the inverter 19 outputs an amplified signal D.

How the fourth embodiment works will now be described. Where the amplifier 1 of FIG. 2 is replaced with another amplifier 1 in FIG. 10, the workings of the amplifier circuit are the same as those of the amplifier circuit constituting the third embodiment discussed with reference to FIGS. 2 through 6, and thus will not be described further.

The amplifier 1 of FIG. 10 may also be controlled likewise in activation and deactivation, which translates into a reduction in power dissipation.

The logical threshold voltage of each of the inverters 16 and 18 is reduced in the fourth embodiment. This keeps the output potential of the inverter 16 and 18 at the Low level even if the potential of the paired output signals from the sense amplifier 12 comes down slightly from the High level under the influence of noise contained in the input signals A and AC. The inverter output potential remains Low unless the potential of the paired output signals from the sense amplifier 12 drops below the logical threshold voltage. In this manner, the potential of the amplified signals DC and D from the inverters 17 and 19 is held High.

The arrangements above provide an amplifier 1 that is offset so that the potential of the amplified signals D and DC is less prone to change from the High to the Low level in the face of a slight change in the input signals A and AC.

The amplifier 1 above minimizes the appearance of noise in the amplified signals D and DC despite some noise that may be contained in the input signals A and AC. The detection circuit 2 is thus not too prone to detect false changes in the amplified signals D and DC. In turn, the latching circuit 3 is made less likely to malfunction. This improves the resistance of the amplifier circuit to noise.

The detection circuit 2 in the fourth embodiment may also be offset. The offset implementation of the detection circuit 2 in the fourth embodiment is the same as that in the third embodiment. Thus the specific measures to carry out the offset and its effects will not be described further.

In the embodiments described earlier, a change of potential from the High to the Low level in one of the amplified signals D and DC output by the amplifier 1 was detected by the detection circuit 2.

Alternatively, the change of the potential level in the amplified signals may occur in the opposite direction depending on the constitution of the amplifier 1. Such a setup is brought about if the inverters 17 and 19 are removed from the amplifier 1 of FIG. 10 wherein the outputs of the inverters 16 and 18 are taken as amplified signals DC and D.

In such a case, when the amplifier 1 of the above structure is in the inactive state, the amplified signals D and DC are both on the Low level. Activating the amplifier 1 amplifies the potential difference between the input signals A and AC. At this point, it is necessary for the detection circuit 2 to detect one of the amplified signals D and DC going High from Low.

In the case above, the detection circuit 2 may be implemented either by adopting a two-input NOR gate, or by partially modifying the detection circuit 2 of FIG. 3. In the partially modified detection circuit, the two-input NAND gate 21 is supplemented with two inverters whose input terminals receive the amplified signals D and DC. The output terminals of the added inverters are connected to the input terminals of the two-input NAND gate 21.

The detection circuit 2 of the above constitution may be offset in such a manner that the circuit is less prone to detect noise-induced changes in the amplified signals D and DC. This prevents the amplifier 1 from malfunctioning even if noise is contained in the amplified signals D and DC.

Specifically, if the detection circuit is constituted by a two-input NOR gate, the logical threshold voltage of the two-input NOR gate need only be made higher than that of any other two-input NOR gate that may exist in the same chip.

Preferably, the logical threshold voltage of the two-input NOR gate should be made higher than that of any two-input NOR gate provided as standard in the same chip.

If the detection circuit is made of two inverters and a two-input NAND gate 21, the logical threshold voltage of the two inverters need only be made higher than that of any inverter that may exist in the same chip.

Preferably, the logical threshold voltage of the two inverters should be made higher than that of any inverter furnished as standard in the same chip.

The latching circuit 3 depicted in FIG. 4 may be replaced with another latching circuit 3 shown in FIG. 7. The internal constitution, connections and operations of the latching circuit 3 in FIG. 7 are the same as those of its partially modified counterpart in the third embodiment and thus will not be described further.

The latching circuit 3 of FIG. 4 may alternatively be replaced with yet another latching circuit 3 of FIG. 8. The internal constitution, connections and operations of the latching circuit 3 in FIG. 8 are the same as those of its counterpart in the second embodiment and thus will not be described further.

Where the latching circuit 3 of FIG. 7 or 8 is utilized, the above-described trouble still persists if the amplifier 1 outputs the amplified signals D and DC in reaction to noise and if the detection circuit 2 detects the resulting faulty change in the amplified signals D and DC.

The drawback above is circumvented either by offsetting in advance the amplifier 1 as described in connection with the fourth embodiment, or by offsetting the detection circuit 2 so that it will not be too prone to detect changes in the amplified signals D and DC. Specific measures to take are the same as those described in conjunction with the latching circuit 3 of FIG. 4 and thus will not be described further. With these measures taken, a noise-resistant amplifier circuit is also implemented.

As described and according to one aspect of the invention, there is provided an amplifier circuit comprising: an amplifier which is activated when supplied with a first control signal and which outputs a pair of amplified signals; a detection circuit for receiving the pair of amplified signals from the amplifier and detecting one of the paired amplified signals being changed in potential, the detection circuit further outputting a detection signal upon detection of the potential change in one of the pair of amplified signals; and a holding circuit for receiving a second control signal and the detection signal from the detection circuit and outputting the first control signal; wherein the holding circuit starts outputting the first control signal in response to an input of the second control signal, terminates the output of the first control signal in response to an input of the detection signal, and holds signal data in effect at the time when the second control signal is terminated.

With this structure, the amplifier is activated in response to the second control signal and inactivated automatically upon detection of one of the pair of amplified signals being changed in potential, the paired signals being output by the amplifier. This structure contributes to reducing currents that flow through the amplifier. The inventive amplifier circuit is implemented by supplementing the amplifier with simple functions constituted by the detection circuit for detecting one of the pair of amplified signals being changed in potential, and by the holding circuit which starts outputting the first control signal upon input of the second control signal and terminates the output of the first control signal upon input of the detection signal.

In one preferred structure according to the invention, the holding circuit may be constituted by an RS latching circuit having a set and a reset input terminal, the set input terminal being fed with the second control signal, the reset input terminal being supplied with the detection signal; wherein the second control signal is terminated earlier than the time when the detection signal is output by the detection circuit.

In another preferred structure according to the invention, the RS latching circuit may include two NAND gates. In a further preferred structure according to the invention, the RS latching circuit may include two NOR gates.

In each of these structures, the function for automatically deactivating the amplifier is implemented by use of circuitry on a limited scale.

In an even further preferred structure according to the invention, the holding circuit may be an edge trigger type holding circuit which holds signal data such that the first control signal is output only in response to either a leading edge or a trailing edge of the second control signal.

In a still further preferred structure according to the invention, the holding circuit may include a two-stage D latch arrangement formed by an upstream and a downstream D latch each supplied with a clock signal in accordance with the second control signal, the first control signal being output in response to an output signal from the downstream D latch.

In each of these structures, only one of the two points of change in the second control signal is used for timing purposes. This facilitates timing design in implementing a circuit for automatically deactivating the amplifier.

In a yet further preferred structure according to the invention, the amplifier circuit may further comprise precharging means for precharging the pair of amplified signals to either a High or a Low potential level while the amplifier is being inactive. Because the paired amplified signals are precharged to the High or Low level with the amplifier in the inactive state, there is no need for a circuit that would activate the detection circuit 2 while the amplifier 1 is in operation. The amplified signals D and DC need only be monitored continuously. Thus the detection circuit 2 is implemented with a simplified circuit constitution.

In another preferred structure according to the invention, the amplifier circuit may further comprise another holding circuit for receiving the pair of amplified signals from the amplifier and holding data corresponding to the received pair of amplified signals. Because the data output by the amplifier are kept intact after the amplifier has become inactive, any circuit that utilizes data from the amplifier may do so regardless of the amplifier being in the active or inactive state.

In a further preferred structure according to the invention, the amplifier may comprise a current mirror type differential amplifier circuit. Control over amplifier activation and deactivation is effected by use of a single gate of the current mirror type differential amplifier circuit. This structure simplifies the control circuit for amplifier activation and deactivation control.

In an even further preferred structure according to the invention, the amplifier may be offset in such a manner that changes in the pair of amplified signals are discouraged.

In a still further preferred structure according to the invention, the amplifier may include two differential amplifier circuits each receiving a pair of input signals, and the amplifier may be offset in such a manner that when the pair of input signals have the same potential, there occurs a potential difference between two output terminals of each of the two differential amplifier circuits. In a yet further preferred structure according to the invention, the amplifier may be offset by creating a difference in size between a transistor connected to one output terminal and a transistor connected to another output terminal of each of the two differential amplifier circuits.

In another preferred structure according to the invention, the amplifier may comprise a differential amplifier circuit, and a logic gate circuit for receiving a pair of output signals from the differential amplifier circuit; wherein, upon comparison of a logical threshold voltage of the logic gate circuit with a logical threshold voltage of any other logic gate circuit of the same logic that may exist in the same chip, the amplifier is offset by shifting the logic threshold voltage of the logic gate circuit in a direction that will discourage detection of changes in the pair of output signals.

In each of these structures, any noise that may be contained in the input signals of the amplifier is prevented from triggering changes in the pair of amplified signals, and the detection circuit is made less prone to detect noise-induced signal changes. This helps prevent the amplifier from getting inadvertently inactivated due to noise.

In a further preferred structure according to the invention, the detection circuit may comprise a logic gate circuit supplied with the pair of amplified signals. Upon comparison of a logical threshold voltage of the logic gate circuit with a logical threshold voltage of any other logic gate circuit of the same logic that may exist in the same chip, the logic gate circuit may be structured so as to shift the logic threshold voltage in a direction that will discourage detection of changes in the pair of amplified signals. With this structure, the detection circuit is made less prone to detect noise-induced changes in the pair of amplified signals. The amplifier is thus protected from getting inadvertently inactivated due to noise.

In an even further preferred structure according to the invention, the logic gate circuit may be constituted by a two-input logic gate circuit capable of detecting one of the pair of amplified signals being changed in potential. This structure allows the detection circuit to be implemented in a simplified circuit constitution, whereby the layout area of the chip is kept from getting inordinately widened.

In a still further preferred structure according to the invention, the holding circuit may comprise initializing means which is reset in response to a third control signal. This structure allows the amplifier to be inactivated whenever amplifying operation is not needed, which translates into a reduction in power dissipation.

In a yet further preferred structure according to the invention, the initializing means may reset the latching circuit when power is applied. This structure prevents the amplifier from getting activated upon power-up, which also translates into a reduction in power consumption.

Further, the present invention is not limited to these embodiments, but variations and modifications may be made without departing from the scope of the present invention.

The entire disclosure of Japanese Patent Application No. Hei 11-278489 filed on Sep. 30, 1999 including specification, claims, drawings and summary are incorporated herein by reference in its entirety.

What is claimed is:

1. An amplifier circuit comprising:
   an amplifier constituted to be activated when supplied with a first control signal and to output a pair of amplified signals;
   a detection circuit for receiving said pair of amplified signals from said amplifier and detecting one of the pair of amplified signals being changed in potential, said detection circuit further outputting a detection signal upon detection of the potential change in one of said pair of amplified signals; and
   a holding circuit for receiving a second control signal and said detection signal from said detection circuit and outputting said first control signal;
   wherein said holding circuit starts outputting said first control signal in response to an input of said second control signal, terminates the output of said first control signal in response to an input of said detection signal, and holds signal data in effect at the time when said second control signal is terminated, and
   said holding circuit is an edge trigger type holding circuit which holds signal data such that said first control signal is output only in response to either a leading edge or a trailing edge of said second control signal.

2. An amplifier circuit comprising:
   an amplifier constituted to be activated when supplied with a first control signal and to output a pair of amplified signals;
   a detection circuit for receiving said pair of amplified signals from said amplifier and detecting one of the pair of amplified signals being changed in potential, said detection circuit further outputting a detection signal upon detection of the potential change in one of said pair of amplified signals; and
   a holding circuit for receiving a second control signal and said detection signal from said detection circuit and outputting said first control signal;
   wherein said holding circuit starts outputting said first control signal in response to an input of said second control signal, terminates the output of said first control signal in response to an input of said detection signal, and holds signal data in effect at the time when said second control signal is terminated;
   said holding circuit is constituted by an RS latching circuit having a set and a reset input terminal, said set input terminal being fed with said second control signal, said reset input terminal being supplied with said detection signal; and
   said second control signal is terminated earlier than the time when said detection signal is output by said detection circuit.

3. The amplifier circuit according to claim 2, wherein said RS latching circuit includes two NAND gates.

4. The amplifier circuit according to claim 2, wherein said RS latching circuit includes two NOR gates.

5. The amplifier circuit according to claim 2, wherein said amplifier comprises a current mirror type differential amplifier circuit.

6. The amplifier circuit according to claim 1, wherein said holding circuit includes a two-stage D latch arrangement formed by an upstream and a downstream D latch each supplied with a clock signal in accordance with said second control signal, said first control signal being output in response to an output signal from said downstream D latch.

7. The amplifier circuit according to claim 1, further comprising precharging means for precharging said pair of amplified signals to either a High or a Low potential level while said amplifier is being inactive.

8. An amplifier circuit comprising:
   an amplifier constituted to be activated when supplied with a first control signal and to output a pair of amplified signals;
   a detection circuit for receiving said pair of amplified signals from said amplifier and detecting one of the pair of amplified signals being changed in potential, said detection circuit further outputting a detection signal upon detection of the potential change in one of said pair of amplified signals; and
   a holding circuit for receiving a second control signal and said detection signal from said detection circuit and outputting said first control signal;
   wherein said holding circuit starts outputting said first control signal in response to an input of said second control signal, terminates the output of said first control signal in response to an input of said detection signal, and holds signal data in effect at the time when said second control signal is terminated;
   said amplifier circuit further comprising another holding circuit for receiving said pair of amplified signals from said amplifier and holding data corresponding to the received pair of amplified signals.

9. The amplifier circuit according to claim 1 wherein said amplifier comprises a current mirror type differential amplifier circuit.

10. The amplifier circuit according to claim 1 wherein said amplifier is offset in such a manner that changes in said pair of amplified signals are discouraged.

11. The amplifier circuit according to claim 10, wherein said amplifier includes two differential amplifier circuits each receiving a pair of input signals to be amplified; and
   wherein said amplifier is offset in such a manner that when said pair of input signals have the same potential, there occurs a potential difference between two output terminals of each of said two differential amplifier circuits.

12. The amplifier circuit according to claim 11, wherein said amplifier is offset by creating a difference in size between a transistor connected to one output terminal and a transistor connected to another output terminal of each of said two differential amplifier circuits.

13. The amplifier circuit according to claim 10, wherein said amplifier comprises:

a differential amplifier circuit for receiving a pair of input signals to be amplified; and a logic gate circuit for receiving a pair of output signals from said differential amplifier circuit;

wherein, upon comparison of a logical threshold voltage of said logic gate circuit with a logical threshold voltage of any other logic gate circuit of the same logic in the same chip, said amplifier is offset by shifting said logic threshold voltage of said logic gate circuit in a direction that will discourage detection of changes in said pair of output signals.

14. The amplifier circuit according to claim 1, wherein said detection circuit comprises a logic gate circuit supplied with said pair of amplified signals; and wherein, upon comparison of a logical threshold voltage of said logic gate circuit with a logical threshold voltage of any other logic gate circuit of the same logic in the same chip, said logic gate circuit is structured so as to shift said logic threshold voltage in a direction that will discourage detection of changes in said pair of amplified signals.

15. The amplifier circuit according to claim 14, wherein said logic gate circuit is constituted by a two-input logic gate circuit for detecting one of said pair of amplified signals being changed in potential.

16. An amplifier circuit comprising:

an amplifier constituted to be activated when supplied with a first control signal and to output a pair of amplified signals;

a detection circuit for receiving said pair of amplified signals from said amplifier and detecting one of the pair of amplified signals being changed in potential, said detection circuit further outputting a detection signal upon detection of the potential change in one of said pair of amplified signals; and a holding circuit for receiving a second control signal and said detection signal from said detection circuit and outputting said first control signal;

wherein said holding circuit starts outputting said first control signal in response to an input of said second control signal, terminates the output of said first control signal in response to an input of said detection signal, holds signal data in effect at the time when said second control signal is terminated; and said holding circuit comprises initializing means which is reset in response to a third control signal.

17. The amplifier circuit according to claim 16, wherein said initializing means resets said holding circuit when power is applied.

* * * * *